US008890018B2

(12) United States Patent
Jung et al.

(10) Patent No.: US 8,890,018 B2
(45) Date of Patent: Nov. 18, 2014

(54) METHOD AND APPARATUS FOR IMPROVED SORTING OF DICED SUBSTRATES

(75) Inventors: Jong Jae Jung, Singapore (SG); Yun Suk Shin, Singapore (SG); Hae Choon Yang, Singapore (SG); Deok Chun Jang, Singapore (SG)

(73) Assignee: Rokko Systems Pte Ltd., Singapore (SG)

( * ) Notice: Subject to any disclaimer, the term of this patent is extended or adjusted under 35 U.S.C. 154(b) by 70 days.

(21) Appl. No.: 13/513,540

(22) PCT Filed: Nov. 30, 2010

(86) PCT No.: PCT/SG2010/000447
§ 371 (c)(1),
(2), (4) Date: Jun. 1, 2012

(87) PCT Pub. No.: WO2011/068478
PCT Pub. Date: Jun. 9, 2011

(65) Prior Publication Data
US 2013/0008836 A1    Jan. 10, 2013

(30) Foreign Application Priority Data
Dec. 1, 2009   (SG) .................................. 200908025

(51) Int. Cl.
*B07C 5/344*   (2006.01)
*H01L 21/66*   (2006.01)

(52) U.S. Cl.
CPC ...................................... *H01L 22/20* (2013.01)
USPC ........................ 209/573; 198/402; 414/416.03

(58) Field of Classification Search
USPC ........... 209/571–573; 324/158.1; 414/416.03, 414/416.08; 198/402, 403
See application file for complete search history.

(56) References Cited

U.S. PATENT DOCUMENTS

| 5,827,394 | A | 10/1998 | Lu | |
| 6,075,216 | A | 6/2000 | Nakamura et al. | |
| 7,353,954 | B1 * | 4/2008 | Malek et al. | 209/542 |
| 7,851,721 | B2 * | 12/2010 | Sze et al. | 209/573 |
| 7,896,051 | B2 * | 3/2011 | Kang et al. | 156/539 |
| 8,056,698 | B2 * | 11/2011 | Im et al. | 198/402 |
| 2007/0205084 | A1 | 9/2007 | Kobayashi et al. | |

FOREIGN PATENT DOCUMENTS

WO   WO2009096904 A2   8/2009

OTHER PUBLICATIONS

International Search Report and Written Opinion for PCT/SG2010/000447, mailed Jan. 25, 2011, 11 pages.

* cited by examiner

*Primary Examiner* — Michael McCullough
(74) *Attorney, Agent, or Firm* — Lee & Hayes, PLLC

(57) ABSTRACT

A method for inspecting and sorting a plurality of IC units comprising the steps of: delivering a frame containing said IC units to a unit picking station; conducting a first inspection of said units during the delivering step and recording the subsequent result; removing said units from the frame, and moving said units from the unit picking station to a flipping station; conducting a second inspection of said units during the moving step and recording the subsequent result; flipping said units to expose an opposed face said units; conducting a third inspection of said opposed face and recording the subsequent result, then; sorting said units into categories based on the recorded results from the first, second and third inspecting steps.

10 Claims, 13 Drawing Sheets

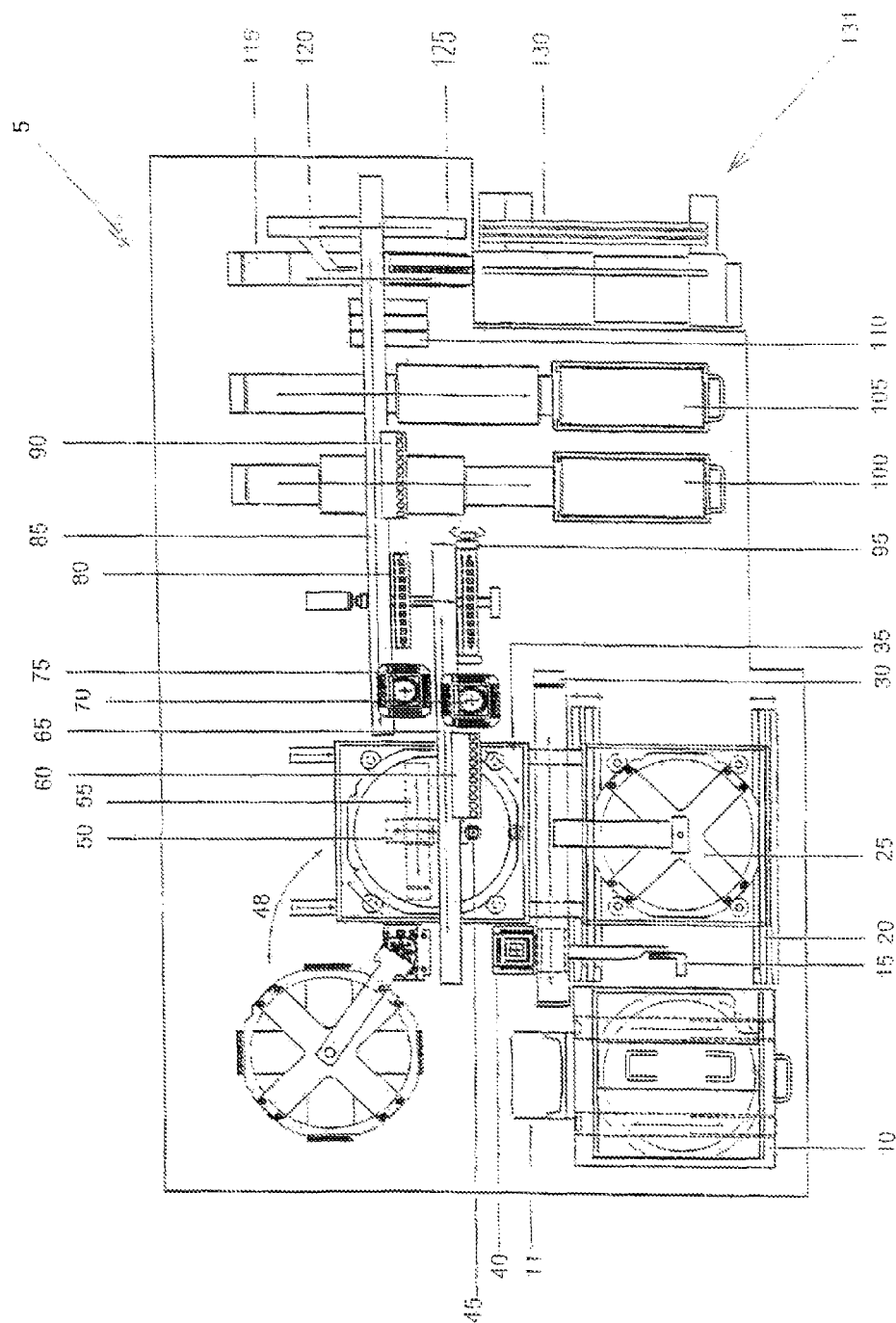

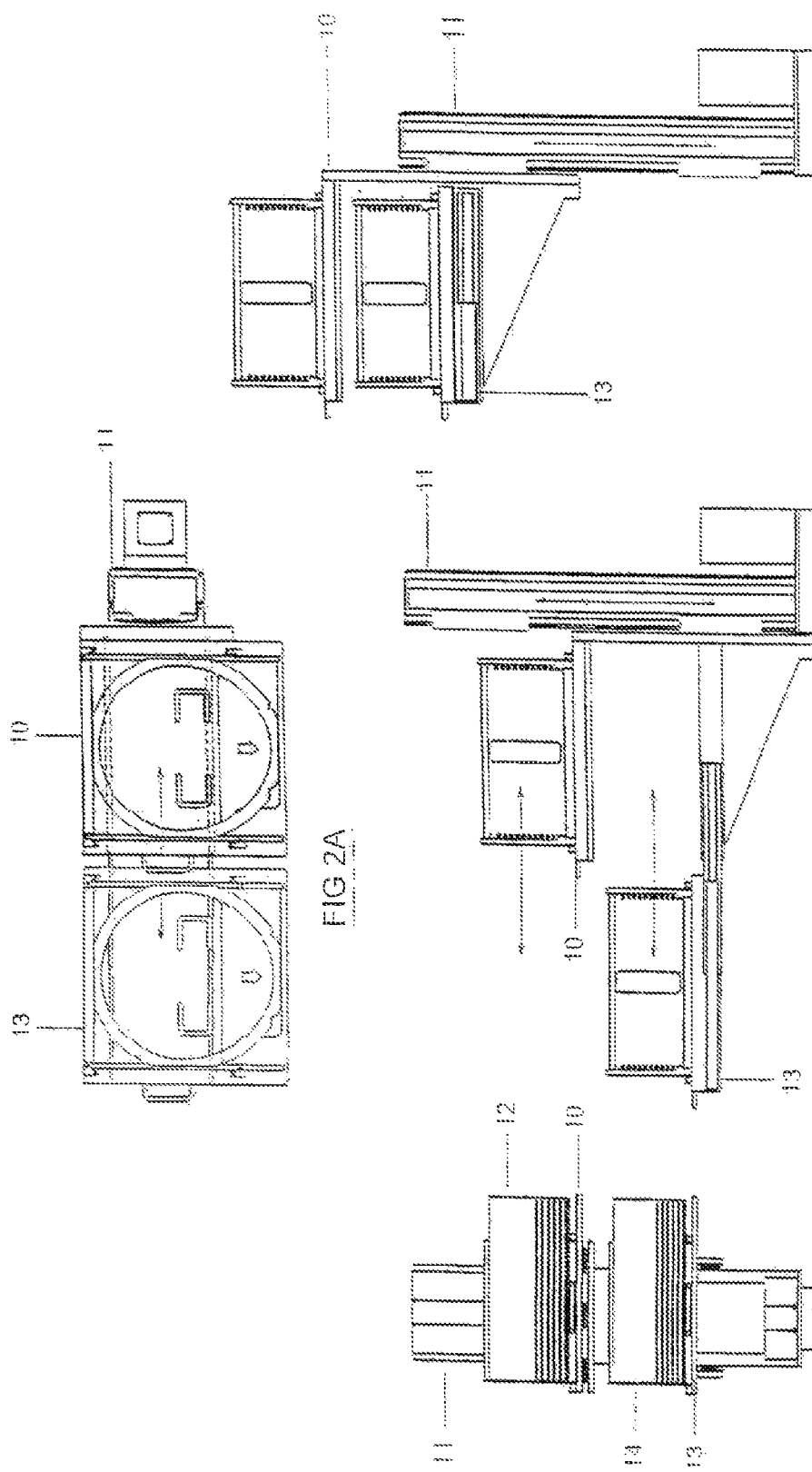

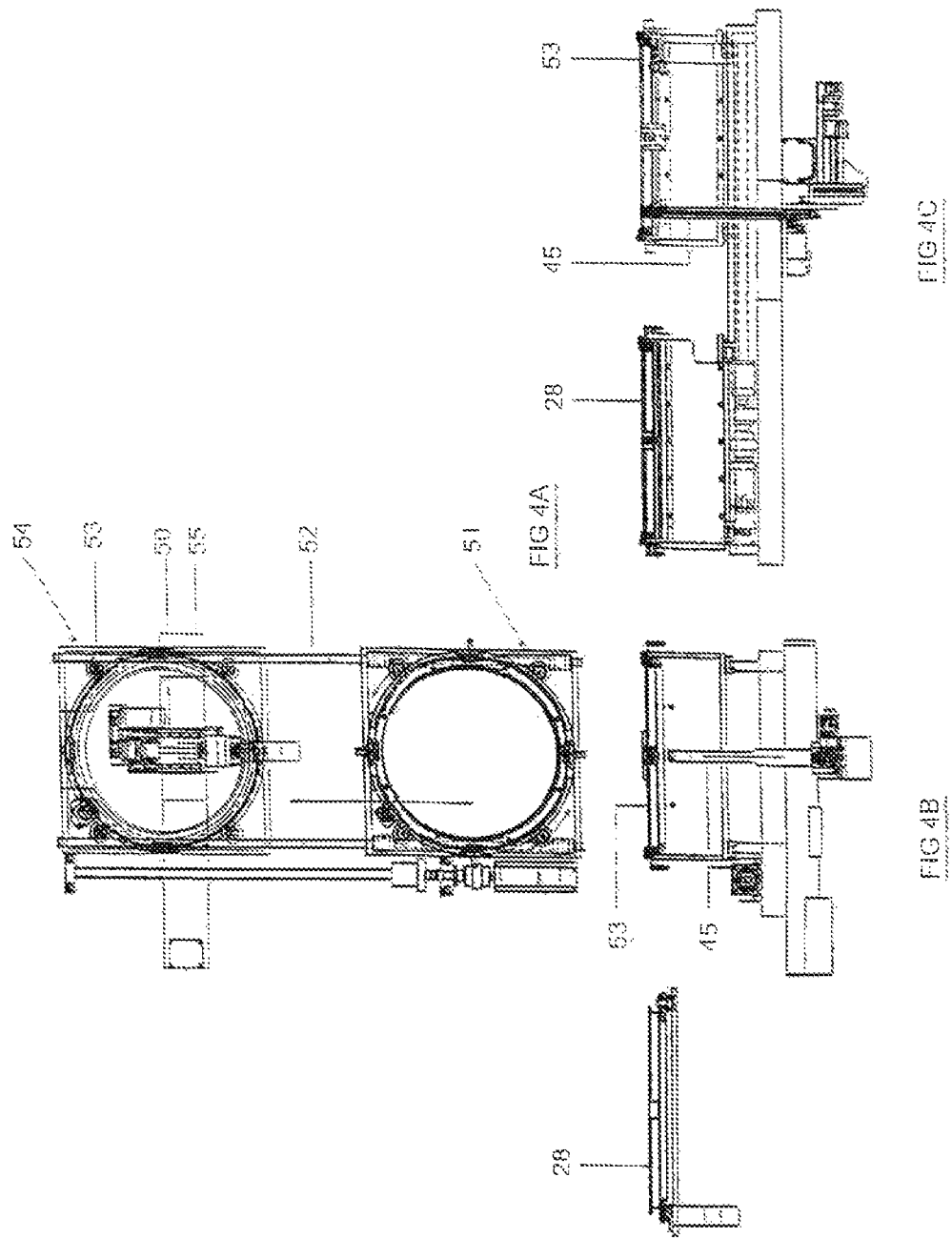

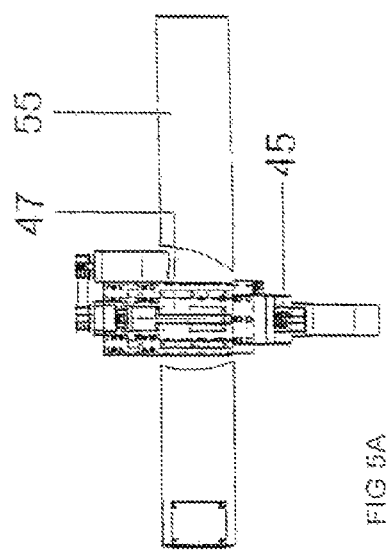
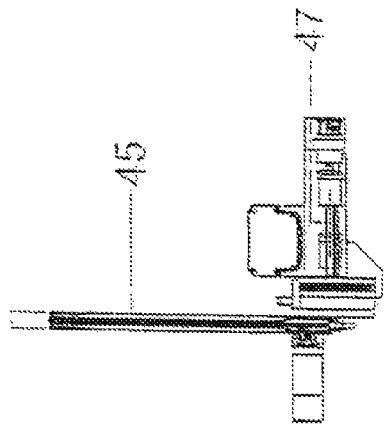

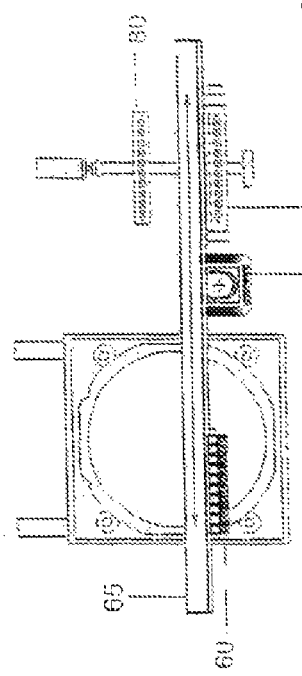
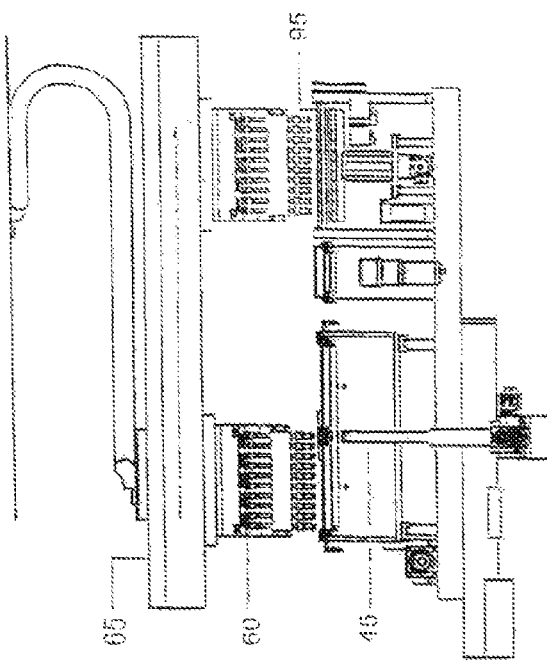
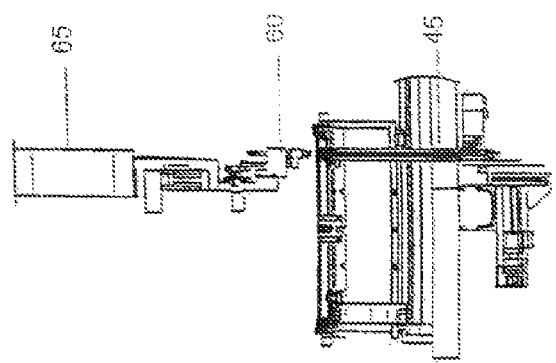
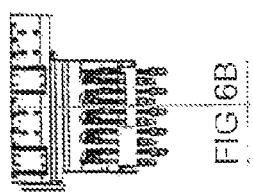
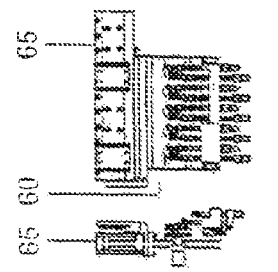

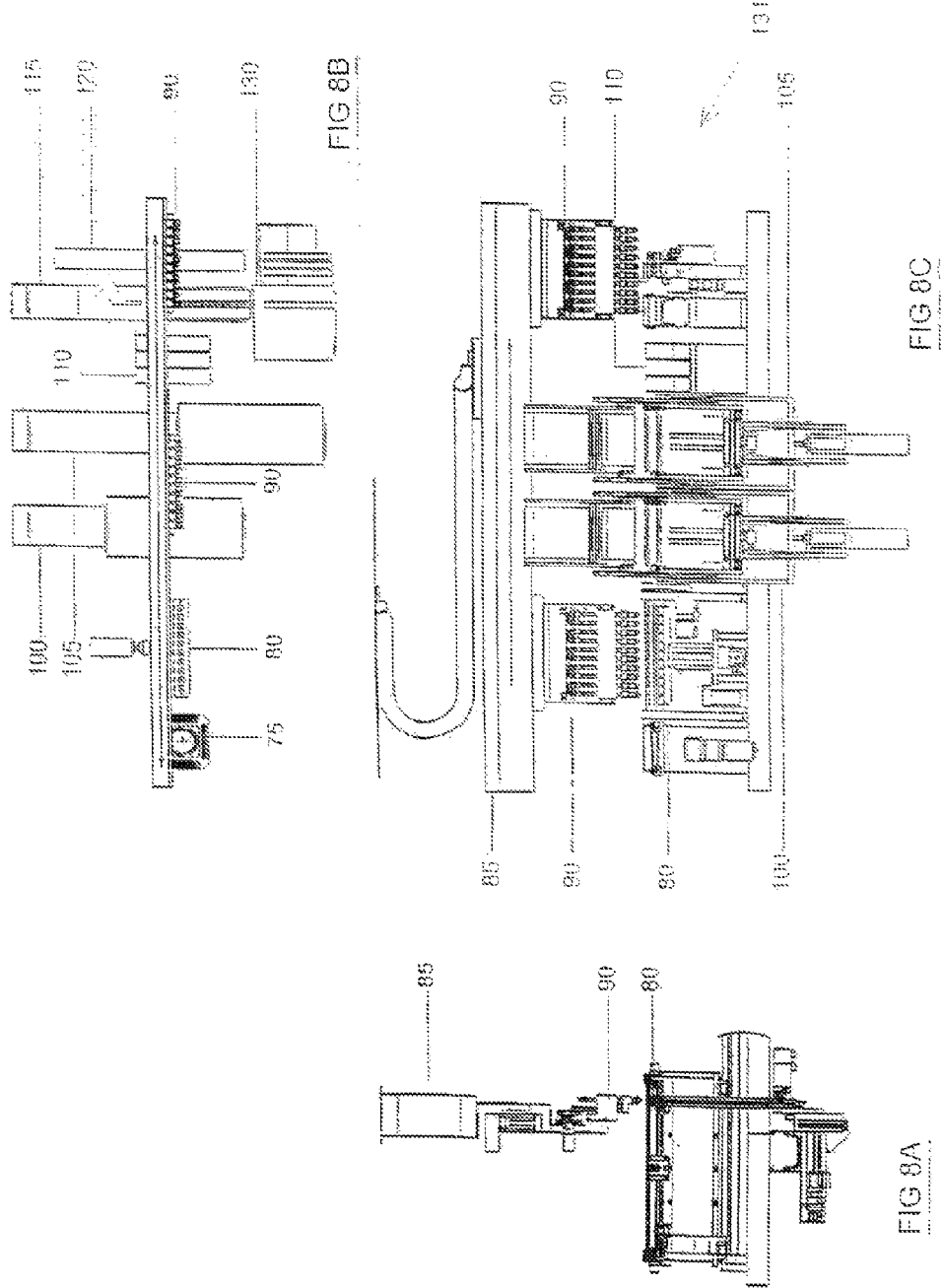

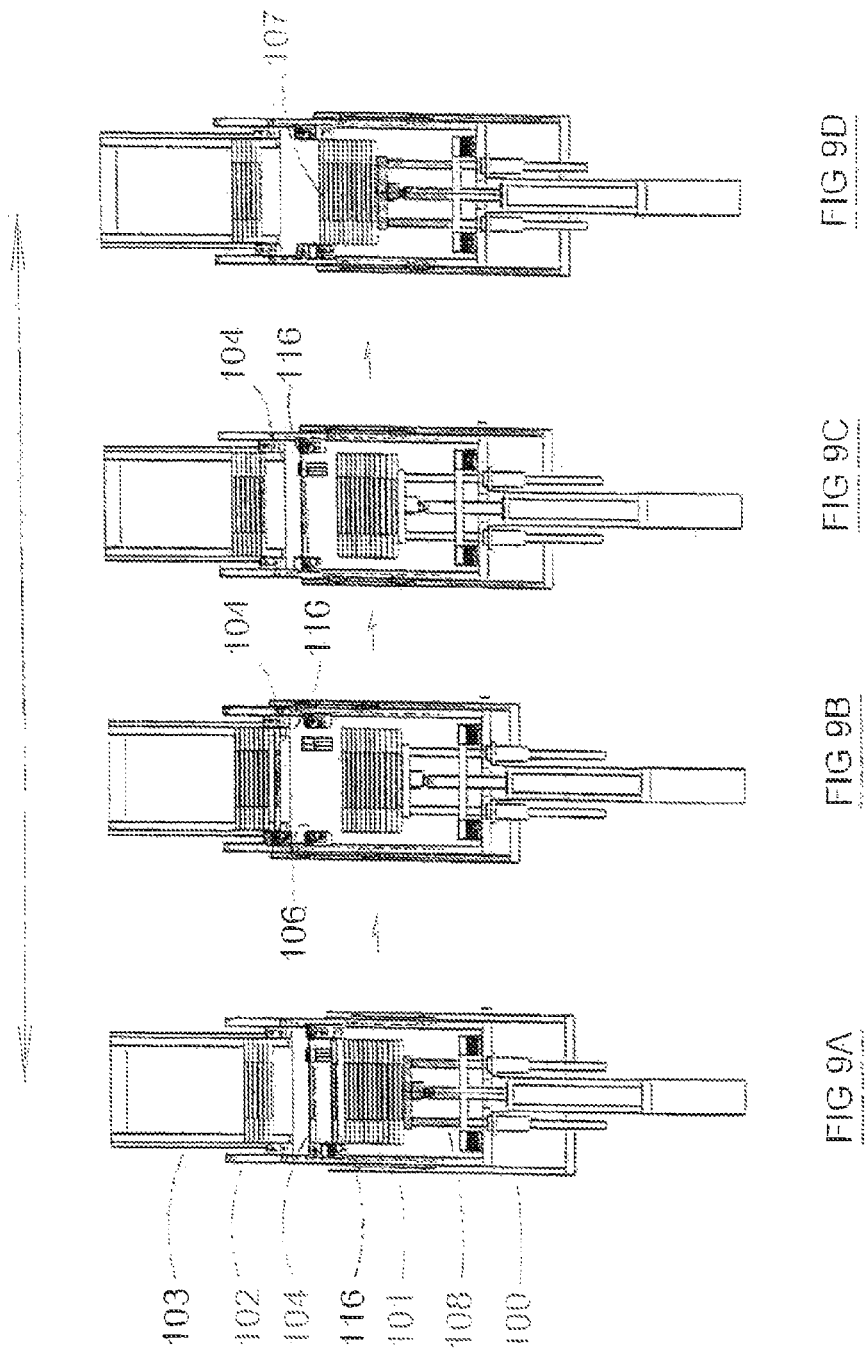

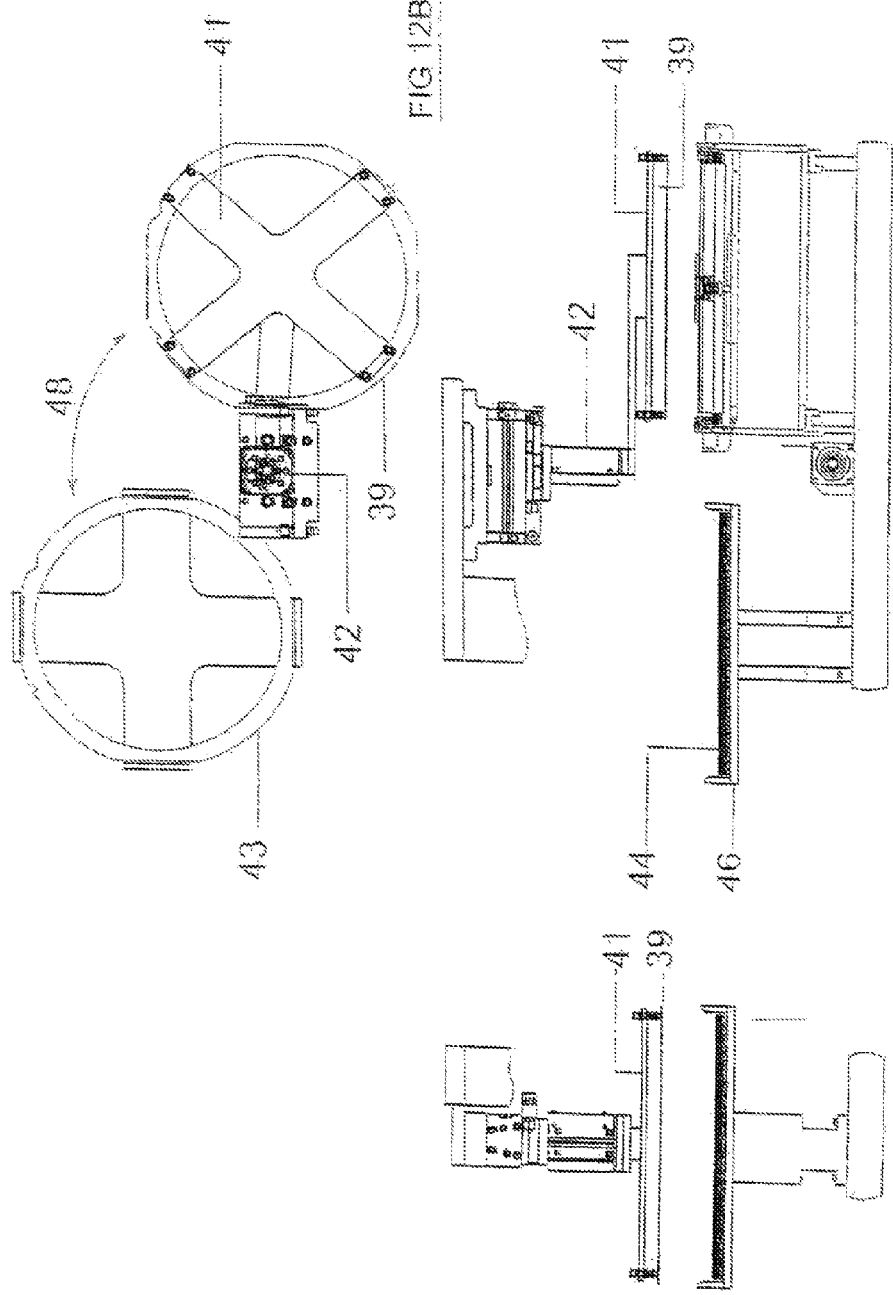

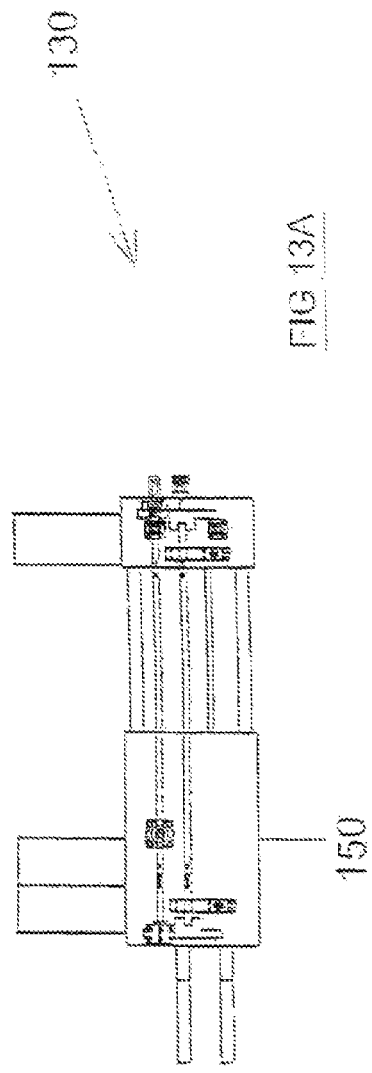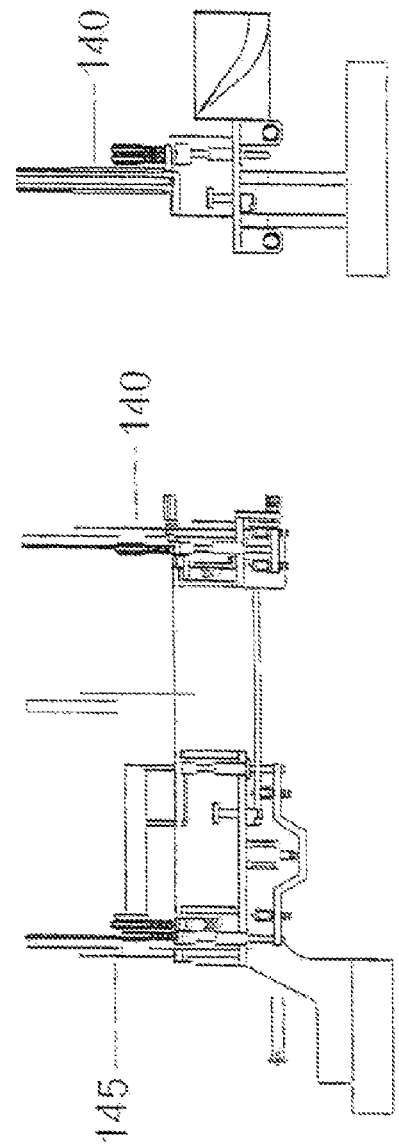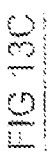

US 8,890,018 B2

METHOD AND APPARATUS FOR IMPROVED SORTING OF DICED SUBSTRATES

PRIORITY APPLICATIONS

This application is a National Phase Entry of and claims priority from PCT/SG2010/000447, title "METHOD AND APPARATUS FOR IMPROVED SORTING OF DICED SUBSTRATES", filed on Nov. 30, 2010, which claims priority to Singapore application 200908025-0, filed on Dec. 1, 2009. The above are herein incorporated by reference.

FIELD OF THE INVENTION

The invention relates to equipment for the handling of integrated circuits and in particular, integrated circuits having been singulated from a substrate.

BACKGROUND OF THE INVENTION

The economics involved in the processing of integrated circuit units are influenced by the rate of units processed, measured in units per hour (UPH).

This rate includes those units not meet specific quality criteria, or units displaced during the processing cycle.

To ensure a batch of units meet this criteria it is necessary to subject batches of IC units to inspection prior to packing or end use.

SUMMARY OF THE INVENTION

In a first aspect, the invention provides a method for inspecting and sorting a plurality of IC units comprising the steps of: delivering a frame containing said IC units to a unit picking station; conducting a first inspection of said units during the delivering step and recording the subsequent result; removing said units from the frame, and moving said units from the unit picking station to a flipping station; conducting a second inspection of said units during the moving step and recording the subsequent result; flipping said units to expose an opposed face said units; conducting a third inspection of said opposed face and recording the subsequent result, then; sorting said units into categories based on the recorded results from the first, second and third inspecting steps.

In a second aspect, the invention provides a system for inspecting and sorting a plurality of IC units comprising: a conveyor for delivering a frame containing said IC units to a unit picking station; a first inspection station contiguous with said conveyor, and arranged to inspect said units; said unit picking station including an ejector positioned to selectively lift one or more units out of said frame, and a unit picker assembly for engaging said one or more units on said ejector; said unit picker assembly further arranged to move the one or more ejected units from the unit picking station to a flipping station; a second inspection station contiguous with said unit picker assembly, and arranged to inspect said ejected units; said flipping station arranged to receive and flip the ejected units to expose an opposed face said units; a third inspection station contiguous with said flipping station, and arranged to inspect said flipped units, and; a sorting station for receiving said units and arranged to place said units into designated bins based on results from the first, second and third inspection stations.

The present invention is directed to providing a system and method that is capable of inspecting and sorting units in batch form.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

FIG. 1 is a plan view of an IC sorting system according to one embodiment of the present invention.

FIGS. 2A to 2D are various views of a loading station according to one embodiment of the present invention.

FIGS. 4A to 4C are various views of a conveyor according to one embodiment of the present invention.

FIGS. 5A to 5C are various views of an ejector assembly according to one embodiment of the present invention.

FIGS. 6A to 6E are various views of an inspection system according to one embodiment of the present invention.

FIGS. 8A to 8C are various views of an unloading system according to one embodiment of the present invention.

FIGS. 9A to 9D are sequential views of a cartridge bin being loaded according to one embodiment of the present invention.

FIGS. 12A to 12C are various views of a ring disposal system according to one embodiment of the present invention.

FIGS. 13A to 13C are various views of a tube racking system according to one embodiment of the present invention.

DETAILED DESCRIPTION

Figure 3A:
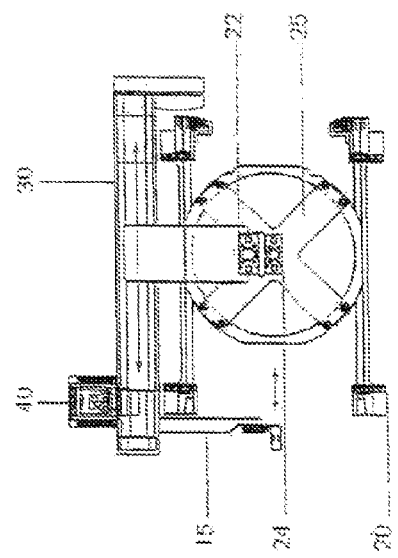
FIGS. 3A to 3C are various views of a receiving station according to one embodiment of the present invention.

FIG. 1 shows a plan view of the IC sorting system 5 according to one embodiment of the present invention. Here a loading station as shown in FIGS. 2A to 2D includes a lift 11 lifting two platforms 10, 13 having cassettes 12, 14 of frames for delivery to the sorting system. The individual frames are loaded into the cassettes prior to placement on the platforms 10, 13. The platforms are movable vertical through a lift 11, so that the first platform 10 can empty the corresponding cassette 12, before moving the next platform 13 upwards, as shown in FIG. 2D, to maintain feeding frames into the device.

As the first cassette empties, the next moved into place and the first can be slid outwards, as shown in FIG. 2C to replace the empty cassette with a new one. Thus, the supply of cassettes is maintained, so long as the cassettes are replaced.

Figure 3C:
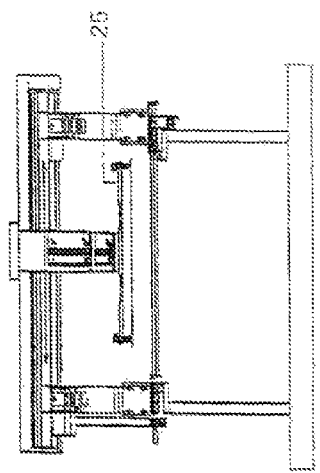
Figure 3B:
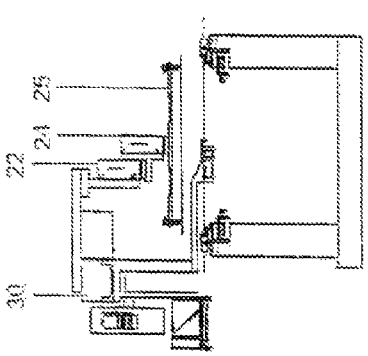

The process commences with a frame taken from the available cassette 12, 14 engaged by a gripper 15. The gripper 15 pulls the frame from the cassette and places onto two laterally projecting ledges within a receiving station, as shown in FIGS. 3A to 3C. The ledges are movable in the lateral direction so as to accommodate the placement of the frame. Thus they retract as the frame is delivered and project into the space provide so as to support the frame in place.

A frame engagement assembly, such as a frame picker 25, then lowers to engage the frame by extending a first vertically oriented actuator 22. The ledges are then retracted again, and the frame picker 25 is lowered further to a carriage 28, by the first and a second vertically oriented actuator 24, mounted in series with the first 22.

As shown in FIGS. 4A to 4C, the carriage 28 receives the frame which delivers the frame from the receiving station 51 to a unit picking station 54 along a conveyor 52. In this case, the conveyor 52 is a worm drive operated by a motor to move the carriage into place. At a point along the delivery path the frame undergoes a first inspection from a first vision device 40. The purpose of the first vision device 40 is to identify and record the type of unit being processed and the alignment of the singulated units. The camera 40 is movable along a rail 30 which, together with the orthogonal movement of the conveyor 52 allows each unit to be inspected whilst located in the carriage 28.

Following inspection the carriage continues on to the unit picking station for the removal of units from the frame. Within the unit picking station is an ejector 45 as shown in FIGS. 5A to 5C for individually engaging and lifting individual IC units from the frame to be engaged and removed by a picker 60. The ejector 45 is located beneath the frame and is movable along a rail 55. The frame is further rotatable on a turntable 53, and together with linear movement of the ejector 45 along the ejector rail 55 allows the ejector 45 to access each unit within the frame. The turntable 53 rotates for orientation and alignment. The turntable 53 is movable in the Y-direction and the ejector 45 is movable in the X-direction along the rail 55, so that the ejector 45 can access each unit within the frame.

As shown in FIGS. 6A to 6D, the picker 60 is movable along a rail 65 to transport an array of units from the frame to a flipper 95. The picker, in the embodiment engages 10 units at one time, with the flipper accommodating 10 units. It will be clear that any number of units may also be accommodated in alternative embodiments.

The type of picker 60 used in the embodiment is one having reciprocating probes arranged in pairs such that the first of each pair engage five units, then retract to allow the second of each pair to engage the final five units. It will be appreciated that different types of picker may be suitable, and that the type described here is merely one of such suitable types.

The picker 60 moves along the rail 65 so as to deposit the units on the flipper 95 and in so doing passes the second inspection station 70 having vision to collect data on the units transported by the picker 60. In particular the vision 70 is placed beneath the rail 65 so that the vision images the underside of the units which in this case provides a check of the pad of each unit for later determination for sorting. The flipper then inverts.

Figure 7A:
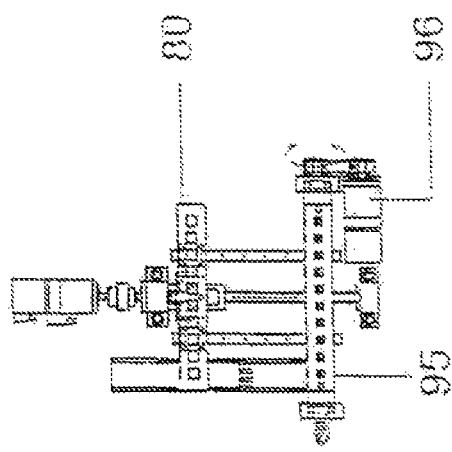
FIGS. 7A to 7C are various views of a flipper according to one embodiment of the present invention.
Figure 7C:
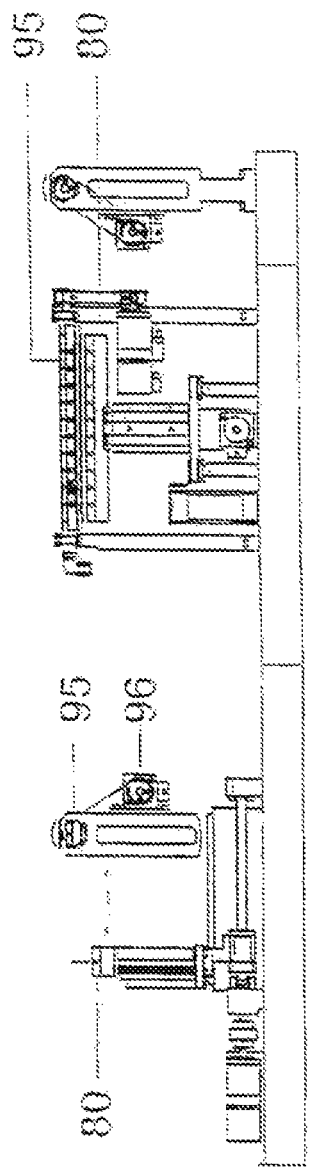
Figure 7B:
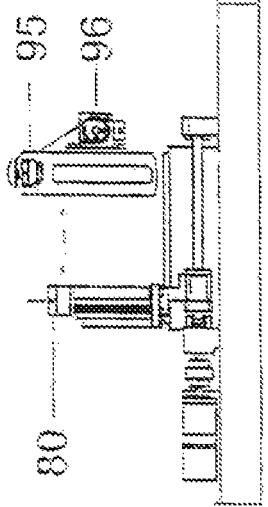

FIGS. 7A to 7C show the flipper 95 and idle block 80 which are mounted upon a worm gear so as to bring the idle block 80 beneath the flipper 95 to receive the IC units on flipping so as to expose the opposed face of the units. The idle block 80 then returns to its original position whereupon the units residing on the idle block are engaged by a picker 90 for eventual placement in the respective bin.

FIGS. 8A to 8C show the arrangement of the picker 90 and the idle block 80. It further shows a third inspection station 75 having vision to check fiduciary marks. In a further embodiment, this inspection station may be a 2.5D inspection, having an array of mirrors arranged in a rectangular arrangement about the camera 75. The third inspection station 75 may be arranged such that the picker moves to the extreme end of the rail 85 and extends the unit to be inspected into the mirror array. Here, not only can the camera have a view of the underside of the unit to check fiduciary marks but also have a side vision due to the array of mirrors to check among other things, any bleeding of leads between cells which may short circuit the integrated circuit unit. Thus the four way mirror array allows a view to check horizontally and thus rather than a three dimensional inspection is known as a 2.5D inspection.

The picker 90 then moves towards the unloading area whereby the picker is arranged to deposit the units according to the results recorded at the previous inspection stations. For instance, the units may be placed in the good bin 100, rework bin 105, reject bin 110 or to a tube offloader 130. The results recorded by each inspection station may be stored on a database accessible for the purposes of sorting said units according to said results.

With respect to the good bin 100 and rework bin 105, FIGS. 9A to 9D show a sequential process for the good bin 100. It will be appreciated that the process shown in FIG. 9A to 9D is equally applicable to the rework bin 105, both of which may be generically called housings.

Figure 10A:
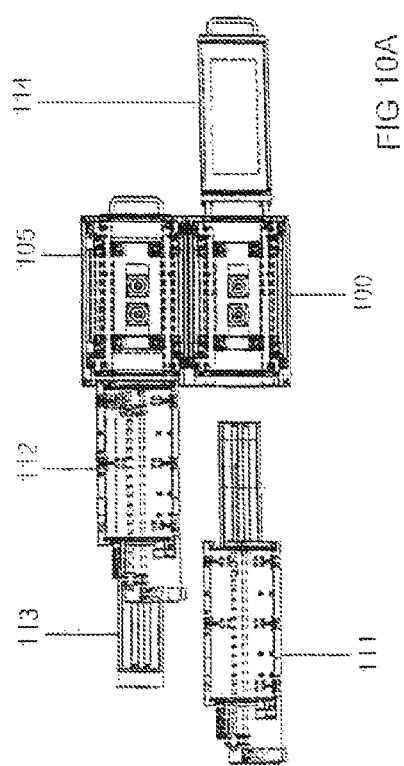
FIGS. 10A to 10C are various views of a loading bin system according to one embodiment of the present invention.
Figure 10C:
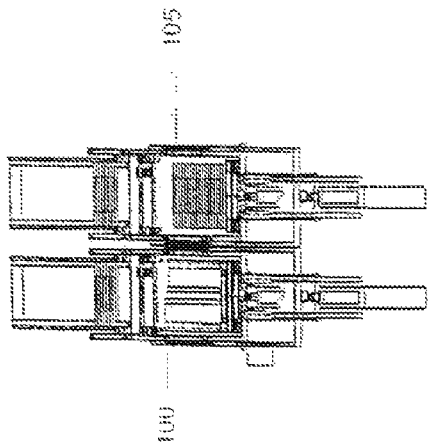
Figure 10B:
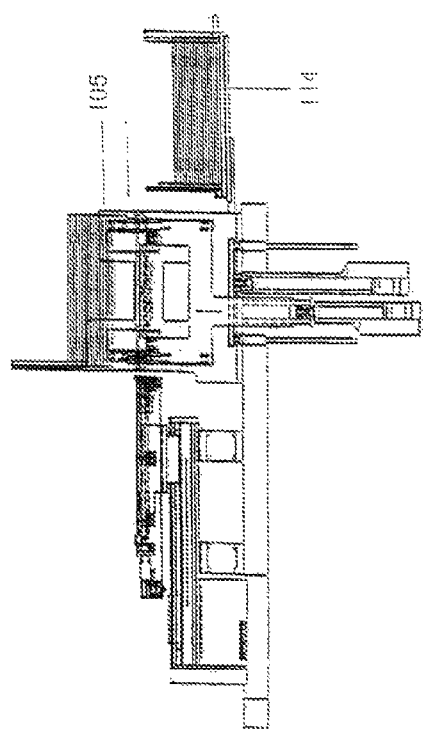

Here, a stack of empty cartridges 101 are vertically disposed on a vertical lift 108 ready to be placed upon the receiving platform 116. With reference to the loading arrangement of the bins shown in FIGS. 10A, 10B and 10C, the position of the loading platform 116 is shown in FIG. 9A is at the same level as the carriage 111 used to receive the integrated circuit units from the picker 90.

After receiving a topmost empty cartridge from the good bin 100, the carriage 111 travels along a rail which moves along an orthogonal axis to the rail 85 of the picker 90. The movement of the picker 90 along the rail 85 together with the movement of the carriage 111 along its respective rail permits access to place the integrated circuit units in a suitable array within a cartridge placed on the carriage 111. On filling the cartridge within the carriage 111, it is returned to the bin 100 and specifically onto a second platform 104. The platforms 104 and 116 then move upwards to place the filled cartridge into the existing stack of filled cartridges 102 in the removable bin 103 as shown in FIG. 9B.

FIG. 9C shows the platform 105 returning to the bin of empty cartridges 101 which is moved upwards by lift 108 to place an empty cartridge onto the platform 116, and so be the topmost empty cartridge to commence the process again.

A gripper then grips the topmost empty cartridge and places it on the carriage 111 to receive the new batch of IC units which will again be placed in the upper platform 104 for eventual placement within the removal bin 103.

Returning to FIGS. 10A to 10C, it can be seen that the empty cartridges are placed within a bin 114 which slides outwards for easy loading of the bin 114.

Figure 11C:
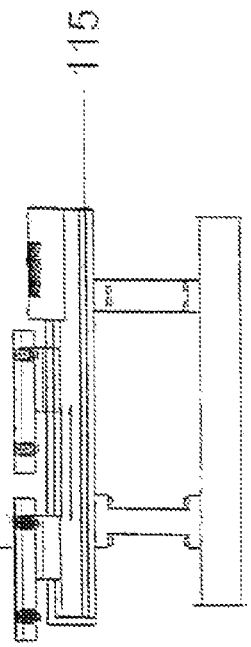
FIGS. 11A to 11C are various views of a tube offloader according to one embodiment of the present invention.
Figure 11A:
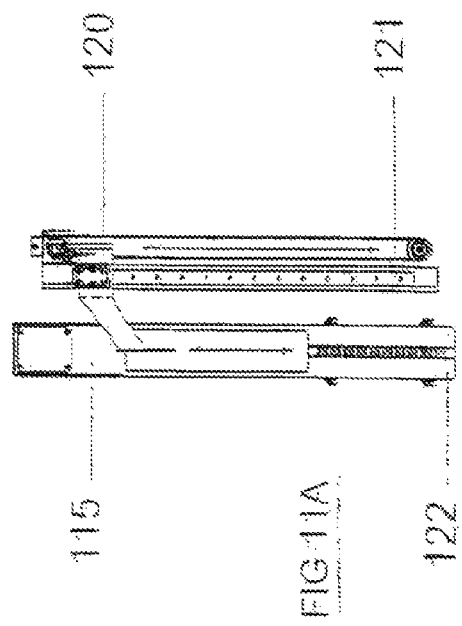
Figure 11B:
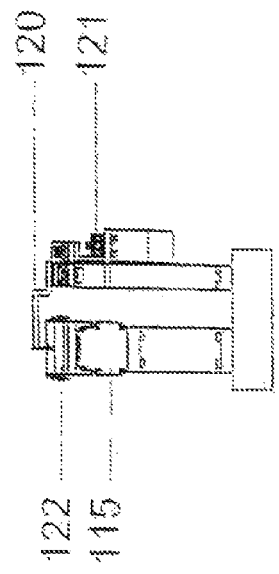

An alternative unloading option is the tube offloader 131 as shown in FIGS. 11A to 11C. Here, a shuttle 122 receives the integrated circuit units from the picker 90. The shuttle 122 has a central groove into which the units are placed which is then subject to a pusher 120 having a probe that corresponds with the groove. When the shuttle 122 is full, the probe moves along the groove to push the units into an awaiting tube. On filling the tube, the tube is pushed into the racking system 130 shown in FIGS. 13A to 13C, ready for transportation.

It will be noted that the shuttle 122 is aligned to place the units into the tube and so is positioned such that the groove is co-linear with the tube as seen in FIG. 1. For convenience in an alternative embodiment, the shuttle may be rotatable so as to receive the integrated circuit units from the picker 90 parallel to the rail 85 upon which the picker 90 moves. Thus in this alternative embodiment, the picker can deposit the units as a group as in this alternative embodiment, the groove and line of units will be co-linear. In the embodiment shown in FIG. 11A to 11C, because the groove is orthogonal to the rail 85, the units must be placed individually. Whilst this is convenient for the tube offloader and reduces the cost of infrastructure, there is advantage through speed and convenience to have the shuttle rotatable from a position where the groove is parallel to the rail 85 to a position where the groove is co-linear with the tube into which the IC units will be placed.

Referring back to FIG. 1 and the unit picking station, in a further embodiment, following the removal of the units from the frame, it is still necessary to remove the frame from the system. In one embodiment, the frame may be returned on the carriage 28 for removal by an operator. However, to prevent a bottleneck of empty frames in one direction and full frames in the other, FIGS. 12A to 12C show an alternative embodiment where the frame is removed from the unit picking station directly. Here, a further frame engagement assembly, such as frame picker 41, is mounted to a rotor 42 for rotating the frame picker 41. In operation, the frame picker 41 engages an empty frame 39 after all the units have been removed. It lifts the frame and rotates away from the unit picking station to a frame bin 46 whereby the frame is released and dropped into the bin. When a supply of empty frames 44 reaches a certain number, it can be removed more efficiently by an operator ready for recycling.

The invention claimed is:

1. A method for inspecting and sorting a plurality of integrated circuit (IC) units comprising the steps of:
    loading a frame containing said IC units to a loading station;
    delivering the frame containing said IC units from said loading station to a unit picking station;
    conducting a first inspection of said units during the delivering step and recording the subsequent result;
    removing said units from the frame, and moving said units from the unit picking station to a flipping station;
    conducting a second inspection of said units during the moving step and recording the subsequent result;
    flipping said units to expose an opposed face of said units;
    conducting a third inspection of said opposed face and recording the subsequent result, then;
    sorting said units into categories based on the recorded results from the first, second and third inspecting steps;
    wherein said loading step includes receiving the frame into a bracket assembly at a first level;
    engaging the frame using a frame engagement assembly; and
    retracting the bracket assembly and lowering the frame into a delivery conveyor.

2. The method according to claim 1, wherein the step of conducting the first inspection includes:
    selectively moving an inspection device along a rail perpendicular to a delivery conveyor such that the combined movement of the delivery conveyor and the inspection device permits inspection of each unit within the frame.

3. The method according to claim 1, further including the steps, after the step of removing the units, of:
    engaging the empty frame with a second frame engagement assembly;
    lifting said empty frame;
    rotating said second frame engagement assembly until said empty frame is clear of the unit picking station, and then;
    disengaging the empty frame.

4. The method according to claim 1 wherein the step of conducting the first inspection includes inspecting the units for any one or a combination of: unit alignment, unit orientation and unit type.

5. The method according to claim 1 wherein the step of conducting the second inspection includes inspecting at least one of the following: pads or balls of said units.

6. The method according to claim 1 wherein the step of conducting the third inspection includes inspecting the units for fiduciary marks.

7. The method according to claim 1 wherein the sorting step includes the steps of:
    determining a category into which each unit is designated based upon said recorded results;
    delivering each unit to a bin corresponding to each category, and;
    at least one of said bins collecting said units into batches;
    removing said batch of units from said bin.

8. The method according to claim 7 wherein the collecting step includes the steps of:
    providing a supply of empty cartridges vertically disposed within a housing;
    exiting a topmost of said empty cartridges from the housing onto a cartridge rail;
    returning the topmost cartridge to the housing on receiving units during the delivering step;
    moving the filled cartridge upwards within said housing whilst simultaneously raising an empty cartridge to said cartridge rail;
    said batch removing step including removal of the filled cartridge from said housing.

9. A system for inspecting and sorting a plurality of integrated circuit (IC) units comprising:
    a loading station for loading a frame to a conveyor;
    said conveyor for delivering the frame containing said IC units to a unit picking station;
    a first inspection station contiguous with said conveyor, and arranged to inspect said units;
    said unit picking station including an ejector positioned to selectively lift one or more units out of said frame, and a unit picker assembly for engaging said one or more units on said ejector;
    said unit picker assembly further arranged to move the one or more ejected units from the unit picking station to a flipping station;
    a second inspection station contiguous with said unit picker assembly, and arranged to inspect said ejected units;
    said flipping station arranged to receive and flip the ejected units to expose an opposed face of said units;
    a third inspection station contiguous with said flipping station, and arranged to inspect said flipped units, and;
    a sorting station for receiving said units and arranged to place said units into designated bins based on results from the first, second and third inspection stations;
    wherein said loading station includes a bracket assembly arranged to receive the frame at a first level, and a frame engagement assembly, such that on retraction of said bracket assembly, said frame engagement assembly is arranged to lower the frame into engagement with the conveyor.

10. The system according to claim 9, wherein the unit picking station further includes a second frame engagement assembly;
    said second frame engagement assembly arranged to lift and rotate the frame to a disengagement position, so as to remove the frame from the unit picking station.

* * * * *